United States Patent
Fang et al.

(10) Patent No.: US 9,419,631 B2
(45) Date of Patent: Aug. 16, 2016

(54) CHARGE PUMP CIRCUIT USED FOR CHARGE PUMP PHASE-LOCKED LOOP

(71) Applicant: UNIVERSITY OF ELECTRONIC SCIENCE AND TECHNOLOGY OF CHINA, Chengdu, Sichuan (CN)

(72) Inventors: Jian Fang, Sichuan (CN); Yaoyao Jia, Sichuan (CN); Tongwei Yuan, Sichuan (CN); Hua Pan, Sichuan (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 14/651,340

(22) PCT Filed: Dec. 10, 2013

(86) PCT No.: PCT/CN2013/088977
§ 371 (c)(1),
(2) Date: Jun. 11, 2015

(87) PCT Pub. No.: WO2014/090136
PCT Pub. Date: Jun. 19, 2014

(65) Prior Publication Data
US 2015/0318859 A1    Nov. 5, 2015

(30) Foreign Application Priority Data
Dec. 12, 2012    (CN) .......................... 2012 1 0534844

(51) Int. Cl.
*H03L 7/06*       (2006.01)
*H03L 7/085*      (2006.01)
*H03L 7/089*      (2006.01)

(52) U.S. Cl.
CPC .............. *H03L 7/085* (2013.01); *H03L 7/0891* (2013.01)

(58) Field of Classification Search
CPC ....... H03L 7/0895; H03L 7/0896; H03L 7/18; H03L 7/0891; H03L 7/0893
USPC .................................. 327/148, 157, 534–536
See application file for complete search history.

(56) References Cited

U.S. PATENT DOCUMENTS

| 7,102,400 | B1 |   | 9/2006 | Mulders |
| 7,876,136 | B2 | * | 1/2011 | Ha ................. H03L 7/0896 327/148 |

(Continued)

FOREIGN PATENT DOCUMENTS

| CN | 201008144 Y | 1/2008 |
| CN | 101572481 A | 11/2009 |

(Continued)

OTHER PUBLICATIONS

International Search Report for PCT/CN2013/088977 of Mar. 20, 2014.
International Search Report for PCT/CN2013/088977 dated Mar. 20, 2014.
Written Opinion of the International Search Authority for PCT/CN2013/088977 dated Mar. 20, 2014.

(Continued)

*Primary Examiner* — Lincoln Donovan
*Assistant Examiner* — Diana J Cheng
(74) *Attorney, Agent, or Firm* — Pearne & Gordon LLP

(57) ABSTRACT

A charge pump circuit used for a charge pump phase-locked loop that includes a charging and discharging unit, two complementary circuit units, two operational amplifier units, an inverter unit, and a current mirror unit. The charge pump circuit resolves the matching problem of charging and discharging currents and the charge sharing problem in existing charge pump circuits. Both complementary circuit units positively and reversely compensate the charging and discharging unit to keep the charging and discharging currents of capacitors constant. Thus, the problem of the change of charging and discharging currents is resolved, the voltage linear variation of the charge pump capacitors is achieved, and the charging and discharging of the capacitors can be accurately controlled. The charge pump circuit is simple in structure, easy to integrate, high in the matching precision of the charging and discharging current sources, and suitable for low voltage and low power consumption applications.

6 Claims, 4 Drawing Sheets

(56) References Cited

U.S. PATENT DOCUMENTS

2009/0033383 A1 2/2009 Wyatt et al.
2015/0318859 A1 11/2015 Fang et al.

FOREIGN PATENT DOCUMENTS

| CN | 102158075 A | 8/2011 |
| CN | 102185473 A | 9/2011 |
| CN | 102710124 A | 10/2012 |
| CN | 103036422 A | 4/2013 |
| CN | 103036442 A | 4/2013 |
| KR | 101007664 | 7/2009 |
| TW | I264877 B | 10/2006 |
| WO | 2008030182 A1 | 3/2008 |

OTHER PUBLICATIONS

Office action for CN 201210534844.5 dated Jun. 30, 2014.
Yaoyao, Jia et al., "A Charge Pump with reduced current variation and mismatch in low-voltage low-power PLLs" In: IEEE, 2013.
Jung, Melanie et al., "A Chargepump with enhanced Current Matching and reduced Clock-Feedthrough in Wireless Sensor Nodes" In: Proceedings of Asia-Pacific Microwave Conference, IEICE, 2010, pp. 2291-2294.
Yaoyao, Jia et al, "A chargepump with perfect current matching in CP-PLL", Dec. 2012, pp. 176-179.
Hwang, M.-S. et al, "Reduction of pump current mismatch in charge-pump PLL" In: Electronic Letters, Jan. 29, 2009, vol. 35, No. 3.

* cited by examiner

CHARGE PUMP CIRCUIT USED FOR CHARGE PUMP PHASE-LOCKED LOOP

This application is a National Stage application of PCT international application PCT/CN2013/088977, filed on Dec. 10, 2013, which claims priority to Chinese patent application No. 201210534844.5 titled "CHARGE PUMP CIRCUIT FOR CHARGE PUMP PHASE-LOCKED LOOP" and filed with the Chinese State Intellectual Property Office on Dec. 12, 2012, both of which are incorporated herein by reference in their entirety.

FIELD

The present disclosure relates to the technical field of electronics, relates to an integrated circuit design technique, and in particular relates to a charge pump circuit for a charge pump phase-locked loop.

BACKGROUND

A Phase Locked Loop (PPL) is an important module in an analog integrated circuit and a hybrid digital-analog integrated circuit, and is applied widely in fields such as wireless communication, frequency synthesis and clock recovery. A charge pump phase-locked loop (CPPLL) among various phase locked loops is widely applied to chip designs due to its high stability, wide capture range, and a digitized phase frequency discriminator.

The phase-locked loop is a feedback system in which a phase of an input signal is compared with a phase of an output signal.

FIG. 1 shows a structural diagram of a typical charge pump phase-locked loop system, which includes modules such as a phase frequency discriminator (PFD) 100, a charge pump (CP) 200, a loop filter (LF) 300, a voltage-controlled oscillator (VCO) 400 and a Multi-Modulus Divider (MMD) 500.

The CP 200 plays an important part in the system in that: the CP 200 converts a digital control signal output from the PFD 100, including a charging control signal UP and a discharging control signal DOWN, into an analog signal, and then controls an output frequency of the VCO 400 to realize a phase-locked function.

Here, the analog signal is required to have a small ripple and a good linearity degree. Thus, the CP 200 is required to meet two conditions that: a charging current and a discharging current are the same and are maintained constant within a certain range. In practice, the CP 200 has a serious current mismatch since due to limitations caused by undesired factors such as a channel modulation effect of MOS, a charge sharing and a charge injection, which is a main factor affecting the performance of the loop.

As shown in FIG. 2, a first existing charge pump circuit includes PMOS current mirrors MP1 and MP2, NMOS current mirrors MN2 and MN4, a PMOS switch transistor MP4, an NMOS switch transistor MN3, a bias circuit NMOS switch transistor MN5, output control signals from a phase frequency discriminator, UP and DOWN, and a charge pump capacitor $C_{cp}$. The main circuit may include a first branch circuit 11 and a second branch circuit 12.

The bias circuit provides a bias voltage and a bias current to a post-stage circuit. I1 is a current flowing through the PMOS transistor MP2 in the first branch circuit 11. I2 is a current flowing through the NMOS transistor MN1 of the first branch circuit 11. $I_1/I_2$ mirrors a reference current $I_{ref}$ in a certain proportion. MP4 is switched on or switched off by the output control signal UP from the phase frequency discriminator, while MN3 is switched on or switched off by the output control signal DOWN from the phase frequency discriminator. In a case that the signals UP and DOWN are low levels, MP4 is switched on while MN3 is switched off, $I_{ch}$ is a current flowing through the PMOS transistor MP4 in the second branch circuit 22, $I_{dis}$ is a current flowing through the NMOS transistor MN3 in the second branch circuit 22, and $I_{dis}$ mirrors $I_1$ to charge the capacitor $C_{cp}$. In a case that the signals UP and DOWN are high levels, MP4 is switched off while MN3 is switched on, and $I_{dis}$ mirrors $I_2$ to discharge the capacitor $C_{cp}$. In a case that MP4 and MN3 each are switched off, the capacitor is not charged or discharged, and $V_{cp}$ is maintained constant.

The above circuit has an issue of current mismatch in a current mirror and an issue of charge sharing. For the issue of current mismatch in a current mirror, due to channel modulation effect, a $V_{ds}$ of the transistor MP3 in the PMOS current mirror does not equal to a drain-source voltage $V_{ds}$ of the transistor MN4 in the NMOS current mirror. For example, if $V_{cp}$ (a potential at a node Y shown in FIG. 2) is high, voltages of drain electrodes of MP4 and MN3 are high and $I_{ch}<I_{dis}$. In this case, during a pulsed reset, MP4 and MN3 each will be switched on, which leads to a charge release of the capacitor $C_{cp}$, then $V_{cp}$ is decreased correspondingly but not be maintained constant, which may affect a subordinate circuit. For the issue of charge sharing, the transistor MP3 of the PMOS current mirror and the transistor MN4 of the NMOS current mirror are respectively close to the power supply and the ground, the drain electrodes has certain capacitances. In this case, if the switch transistors MP4 and MP3 each are switched off, then the transistor MP3 charges the node Y to VDC and MN4 discharges a node X to zero potential. At a next phase comparison instant, if the switch transistors MP4 and MP3 each are switched on, the potential at the node X is increased while the potential at the node Y is decreased. If voltage drops on the switch transistors MP4 and MP3 are omitted, $V_X=V_Y=V_{Ccp}$. In this case, a variation of $V_X$ may not always equal to a variation of $V_Y$ even if $C_X=C_Y$, and the difference between $V_X$ and $V_Y$ is provided by $C_{cp}$, thus a jitter occurs on a voltage applied on $C_{cp}$.

It can be seen clearly from FIG. 3 that, $I_{ch}$ is not equal to $I_{dis}$. Narrow reset pulses are introduced in the output signals UP and DOWN from the phase frequency discriminator due to a delay of an internal loop of the phase frequency discriminator. When eliminating a dead zone, the reset pulse may switch on both the PMOS switch transistor and the NMOS switch transistor. In this case, if the charging current is not equal to the discharging current, a net current flowing through the charge pump capacitor $C_{cp}$ is not zero. Hence, the potential at $C_{cp}$ changes fixedly in each period, and a phase error may be generated between an input and an output of the phase-locked loop to keep the phase-locked loop locking.

As shown in FIG. 4, a second existing charge pump circuit includes PMOS current mirrors MP2 and MP4, NMOS current mirrors MN3 and MN5, a PMOS switch transistor MP3, an NMOS switch transistor MN5, bias circuits MN1 and MN2, output control signals UP and DOWN from a phase frequency discriminator and a charge pump capacitor $C_{cp}$. The subject circuit may include a third branch circuit 33 and a fourth branch circuit 44. The circuit may be considered as an improvement of the first charge pump circuit in that: firstly, an operational transconductance amplifier is added, and with a feedback effect, potentials at a node X and a node Y are equal to each other, hence a charging current equals to a discharging current; and secondly, locations of switch transistors are exchanged with locations of current mirrors to address the issue of charge sharing. However, it can be seen from FIG. 5 that, $I_{ch}$ and $I_{dis}$ may change as the output voltage changes even if $I_{ch}=I_{dis}$ in the charge pump circuit; therefore, the charging current and the discharging current are non-constant.

SUMMARY

A charge pump circuit for a charge pump phase-locked loop is provided according to the present disclosure to address the above issue of non-constant charging and discharging currents in the above charge pump circuit.

A charge pump circuit for a charge pump phase-locked loop is provided according to an embodiment of the present disclosure, which includes: a charging and discharging unit, a first complementary circuit unit, a first operational amplifier unit (A1), a phase inverter unit, a second complementary circuit unit, a current mirror unit and a second operational amplifier unit (A2), where an output terminal of the charging and discharging unit is connected to a negative input terminal of the first operational amplifier unit (A1);

an output terminal of the first complementary circuit unit is connected to a positive input terminal of the first operational amplifier unit (A1), and an output terminal of the first operational amplifier unit (A1) is connected to a first input terminal of the charging and discharging unit and a first input terminal of the first complementary circuit unit;

an input terminal of the phase inverter unit is connected to an output terminal of the first complementary circuit unit, and an output terminal of the phase inverter unit is connected to a negative input terminal of the second operational amplifier unit (A2);

an output terminal of the second complementary circuit unit is connected to a positive input terminal of the second operational amplifier unit (A2), and an output terminal of the second operational amplifier unit is connected to an input terminal of the current mirror unit and an input terminal of the second complementary circuit unit; and an output terminal of the current mirror unit is connected to a second input terminal of the charging and discharging unit and a second input terminal of the first complementary circuit unit.

Preferably, the charging and discharging unit includes a PMOS transistor M0, a PMOS transistor M2, an NMOS transistor M4 and an NMOS transistor M6, where a source electrode of the PMOS transistor M0 is connected to a voltage source VDC, a drain electrode of the PMOS transistor M0 is connected to a source electrode of the PMOS transistor M2, and a drain electrode of the PMOS transistor M2 is connected to a drain electrode of the NMOS transistor M4 and the connection point serves as the output terminal of the charging and discharging unit;

the output terminal of the charging and discharging unit is connected to the negative input terminal of the first operational amplifier unit (A1), a source electrode of the NMOS transistor M4 is connected to a drain electrode of the NMOS transistor M6, a source electrode of the NMOS transistor M6 is connected to the ground GND, and a gate electrode of the PMOS transistor M2 serves as the first input terminal of the charging and discharging unit; and the first input terminal of the charging and discharging unit is connected to the output terminal of the first operational amplifier unit (A1), a gate electrode of the NMOS transistor M4 serving as the second input terminal of the charging and discharging unit is connected to the output terminal of the current mirror unit, and a gate electrode of the PMOS transistor M0 and a gate electrode of the NMOS transistor M6 are respectively connected to an output signal UP and an output signal DOWN which are output from a phase frequency discriminator.

Preferably, the first complementary circuit unit includes a PMOS transistor M1, a PMOS transistor M3, an NMOS transistor M5 and an NMOS transistor M7, where a source electrode of the PMOS transistor M1 is connected to a voltage source VDC, a drain electrode of the PMOS transistor M1 is connected to a source electrode of the PMOS transistor M3, and a drain electrode of the PMOS transistor M3 is connected to a drain electrode of the NMOS transistor M5 and the connection point serves as the output terminal of the first complementary circuit unit;

the output terminal of the first complementary circuit unit is connected to the positive input terminal of the first operational amplifier unit (A1), a source electrode of the NMOS transistor M5 is connected to a drain electrode of the NMOS transistor M7, a source electrode of the NMOS transistor M7 is connected to the ground GND and a gate electrode of the PMOS transistor M3 serves as the first input terminal of the first complementary circuit unit;

the first input terminal of the first complementary circuit unit is connected to the output terminal of the first operational amplifier unit (A1), and a gate electrode of the NMOS transistor M5 serves as the second input terminal of the first complementary circuit unit; and the second input terminal of the first complementary circuit unit is connected to the output terminal of the current mirror unit, a gate electrode of the PMOS transistor M1 is connected to the ground GND, and a gate electrode of the NMOS transistor M7 is connected to the voltage source VDC.

Preferably, the phase inverter unit includes a PMOS transistor M8 and an NMOS transistor M9, where a diode connection mode of gate-drain short circuit is adopted in the PMOS transistor M8, a source electrode of the PMOS transistor M8 is connected to a voltage source VDC, a drain electrode of the PMOS transistor M8 is connected to a drain electrode of the NMOS transistor M9 and the connection point serves as the output terminal of the phase inverter unit; and the output terminal of the phase inverter unit is connected to the negative input terminal of the second operational amplifier unit (A2), a gate electrode of the NMOS transistor M9 serves as the input terminal of the phase inverter unit, the input terminal of the phase inverter unit is connected to the output terminal of the first complementary circuit unit and a source electrode the NMOS transistor M9 is connected to the ground GND.

Preferably, the current mirror unit includes a PMOS transistor M10, a PMOS transistor M12, a PMOS transistor M14, an NMOS transistor M15 and an NMOS transistor M17, where a source electrode of the PMOS transistor M10 is connected to a voltage source VDC, a drain electrode of the PMOS transistor M10 is connected to a source electrode of the PMOS transistor M12, and a gate electrode of the PMOS transistor M12 serves as the input terminal of the current mirror unit;

the input terminal of the current mirror unit is connected to the output terminal of the second operational amplifier unit (A2), a drain electrode of the PMOS transistor M12 is connected to a source electrode of the PMOS transistor M14, a diode connection mode of gate-drain short circuit is adopted in both the PMOS transistor M14 and the NMOS transistor M15, and a drain electrode of the PMOS transistor M14 is connected to a drain electrode of the NMOS transistor M15 and the connection point serves as the output terminal of the current mirror unit; and the output terminal of the current mirror unit is connected to the second input terminal of the charging and discharging unit and the second input terminal of the first complementary circuit unit, a source electrode of the NMOS transistor M15 is connected to a drain electrode of the NMOS transistor M17, a gate electrode of the NMOS transistor M17 is connected to the voltage source VDC, and a source electrode of the NMOS transistor M17 is connected to the ground GND.

Preferably, the second complementary circuit unit includes a PMOS transistor M11, a PMOS transistor M13, an NMOS transistor M16 and an NMOS transistor M18, where a source electrode of the PMOS transistor M11 is connected to a voltage source VDC, a drain electrode of the PMOS transistor M11 is connected to a source electrode of the PMOS transistor M13, and a drain electrode of the PMOS transistor M13 is connected to a drain electrode of the NMOS transistor M16 and the connection point serves as the output terminal of the second complementary circuit unit;

the output terminal of the second complementary circuit unit is connected to the positive input terminal of the second operational amplifier unit (A2), a source electrode of the NMOS transistor M16 is connected to a drain electrode of the NMOS transistor M18, a source electrode of the NMOS transistor M18 is connected to the ground GND, and a gate electrode of the PMOS transistor M13 serves as the input terminal of the second complementary circuit unit; and the input terminal of the second complementary circuit unit is connected to the output terminal of the second operational amplifier unit (A2), a gate electrode of the NMOS transistor M16 is connected to an external bias BIAS, a gate electrode of the PMOS transistor M11 is connected to the ground GND, and a gate electrode of the NMOS transistor M18 is connected to the voltage source VDC.

As compared with the conventional technologies, the present disclosure has the following advantages.

As compared with the first existing charge pump circuit, the matching issue of charging and discharging currents and the issue of charge sharing are addressed in the present disclosure. And as compared with the second existing charge pump circuit, two complementary circuit units and two operational amplifier units are adopted in the charge pump circuit according to the present disclosure. The two complementary circuit units respectively compensate the charging and discharging unit in a positive way and a negative way. In this case, the charging current and discharging current of the capacitor can be constant, thus the issue of non-constant charging and discharging currents is addressed, the voltage of the charge pump capacitor changes linearly, and the capacitor may be charged or discharged more precisely. The charge pump circuit according to the present disclosure is applicable to an application with low voltage and low power consumption since it has a simple structure and a high matching precision between a charging current source and a discharging current source and is easy to be integrated.

BRIEF DESCRIPTION OF THE DRAWINGS

The drawings to be used in the description of embodiments or the conventional technology are described briefly as follows, so that technical solutions according to the embodiments of the present disclosure or according to the conventional technology may become clearer. It is apparent that the drawings in the following description only illustrate some embodiments of the present disclosure. For those skilled in the art, other drawings may be obtained based on these drawings without any creative work.

DETAILED DESCRIPTION

Technical solutions according to embodiments of the present disclosure are described clearly and completely hereinafter in conjunction with the drawings. It is apparent that the described embodiments are only a part rather than all of the embodiments according to the present disclosure. Any other embodiments obtained by those skilled in the art based on the embodiments in the present disclosure without any creative work fall in the scope of the present disclosure.

In order that the objectives, features and advantages of the present disclosure can be more apparent and be better understood, embodiments of the present disclosure are described hereinafter in further detail in conjunction with the drawings.

First Embodiment

Figure 6:
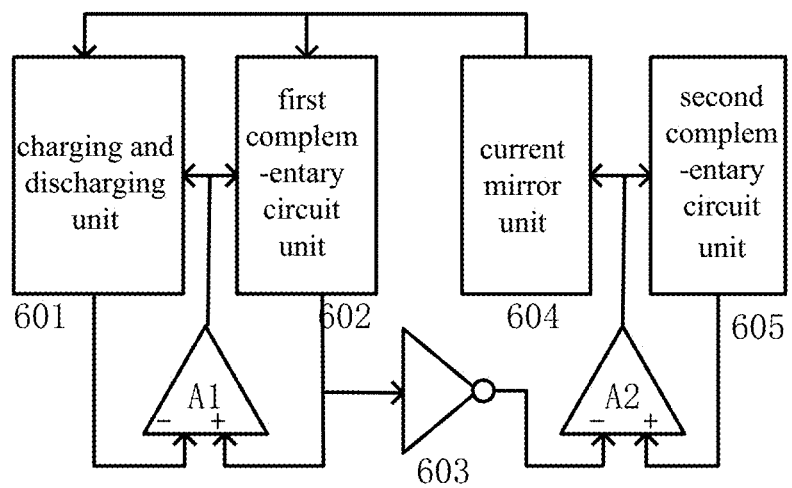
FIG. 6 is a schematic diagram of a charge pump circuit for a charge pump phase-locked loop according to a first embodiment of the present disclosure.

FIG. 6 is a schematic diagram of a charge pump circuit for a charge pump phase-locked loop according to a first embodiment of the present disclosure.

The charge pump circuit for the charge pump phase locked loop according to the embodiment includes a charging and discharging unit 601, a first complementary circuit unit 602, a first operational amplifier unit A1, a phase inverter unit 603, a current mirror unit 604, a second complementary circuit unit 605 and a second operational amplifier unit A2.

An output terminal of the charging and discharging unit 601 is connected to a negative input terminal of the first operational amplifier unit A1, and an output terminal of the first complementary circuit unit 602 is connected to a positive input terminal of the first operational amplifier unit A1.

An output terminal of the first operational amplifier unit A1 is connected to a first input terminal of the charging and discharging unit 601 and a first input terminal of the first complementary circuit unit 602.

An input terminal of the phase inverter unit 603 is connected to an output terminal of the first complementary circuit unit 602, an output terminal of the phase inverter unit 603 is connected to a negative input terminal of the second operational amplifier unit A2, and an output terminal of the second complementary circuit unit 605 is connected to a positive input terminal of the second operational amplifier unit A2.

An output terminal of the second operational amplifier unit A2 is connected to an input terminal of the current mirror unit 604 and an input terminal of the second complementary circuit unit 605, and an output terminal of the current mirror unit 604 is connected to a second input terminal of the charging and discharging unit 601 and a second input terminal of the first complementary circuit unit 602.

It can be seen from the above connections that, the charging and discharging unit 601 and the first complementary circuit unit 602 make a charging current and a discharge current equal to each other with a feedback effect of the first operational amplifier unit A1. The charging and discharging unit 601, the phase inverter unit 603 and the second complementary circuit unit 605 make the charging current and the discharging current constant with a feedback effect of the second operational amplifier unit A2.

Second Embodiment

In the following, a specific implementation of a charge pump circuit for a charge pump phase-locked loop according to the present disclosure is described in detail in conjunction with FIG. 7.

Figure 7:
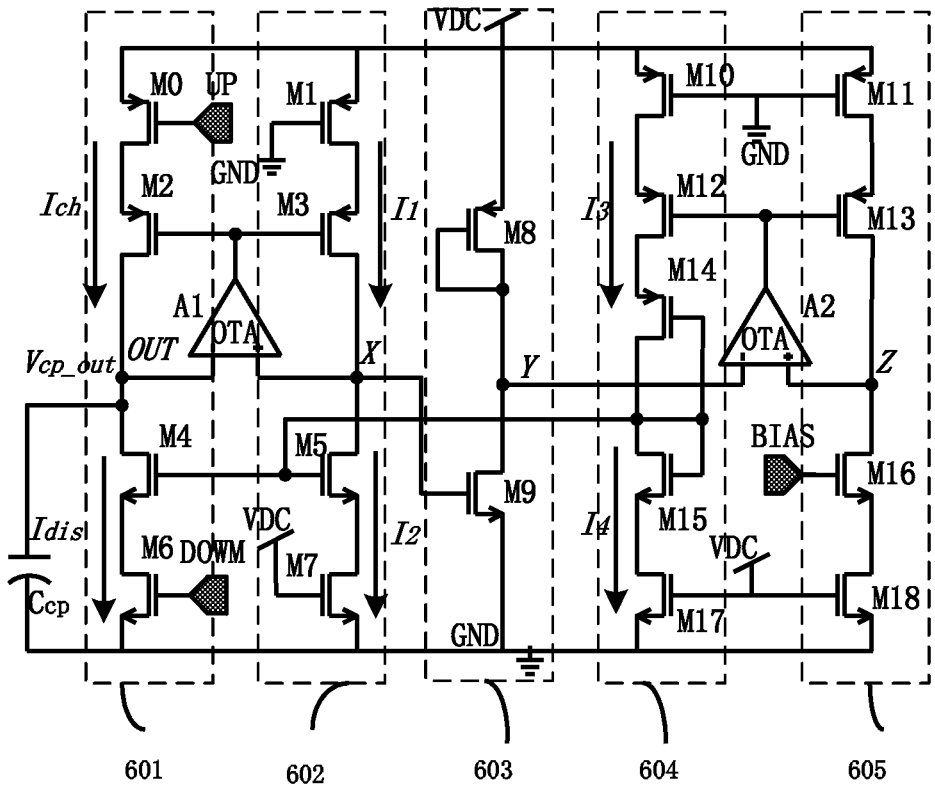
FIG. 7 is a circuit diagram of a charge pump circuit for a charge pump phase-locked loop according to a second embodiment of the present disclosure.

FIG. 7 is a circuit diagram of a charge pump circuit for a charge pump phase-locked loop according to a second embodiment of the present disclosure.

The sub circuit units mentioned in the embodiment corresponding to FIG. 6 are respectively described in the following.

The charging and discharging unit 601 includes PMOS transistors M0 and M2, and NMOS transistors M4 and M6.

A source electrode of the PMOS transistor M0 is connected to a voltage source VDC. A drain electrode of the PMOS transistor M0 is connected to a source electrode of the PMOS transistor M2. A drain electrode of the PMOS transistor M2 is connected to a drain electrode of the NMOS transistor M4, and the connection point serves as the output terminal of the charging and discharging unit 601. The output terminal of the charging and discharging unit 601 is connected to the negative input terminal of the first operational amplifier unit A1.

A source electrode of the NMOS transistor M4 is connected to a drain electrode of the NMOS transistor M6. A source electrode of the NMOS transistor M6 is connected to the ground GND. A gate electrode of the PMOS transistor M2 serves as the first input terminal of the charging and discharging unit 601, and the first input terminal of the charging and discharging unit 601 is connected to the output terminal of the first operational amplifier unit A1.

A gate electrode of the NMOS transistor M4 serves as the second input terminal of the charging and discharging unit 601, and the second input terminal of the charging and discharging unit 601 is connected to the output terminal of the current mirror unit 604.

A gate electrode of the PMOS transistor M0 and a gate electrode of the NMOS transistor M6 are respectively connected to output signals UP and DOWN from a phase frequency discriminator.

The first complementary circuit unit 602 includes PMOS transistors M1 and M3, and NMOS transistors M5 and M7.

A source electrode of the PMOS transistor M1 is connected to a voltage source VDC. A drain electrode of the PMOS transistor M1 is connected to a source electrode of the PMOS transistor M3. A drain electrode of the PMOS transistor M3 is connected to a drain electrode of the NMOS transistor M5 and the connection point serves as the output terminal of the first complementary circuit unit 602, and the output terminal of the first complementary circuit unit 602 is connected to the positive input terminal of the first operational amplifier unit A1.

A source electrode of the NMOS transistor M5 is connected to a drain electrode of the NMOS transistor M7, and a source electrode of the NMOS transistor M7 is connected to the ground GND. A gate electrode of the PMOS transistor M3 serving as the first input terminal of the first complementary circuit unit 602 is connected to the output terminal of the first operational amplifier unit A1. A gate electrode of the NMOS transistor M5 serving as the second input terminal of the first complementary circuit unit 602 is connected to the output terminal of the current mirror unit 604. A gate electrode of the PMOS transistor M1 is connected to the ground GND, and a gate electrode of the NMOS transistor M7 is connected to the voltage source VDC.

The phase inverter unit 603 includes a PMOS transistor M8 and an NMOS transistor M9.

A diode connection mode of gate-drain short circuit is adopted in the PMOS transistor M8. A source electrode of the PMOS transistor M8 is connected to the voltage source VDC. A drain electrode of the PMOS transistor M8 is connected to a drain electrode of the NMOS transistor M9 and the connection point serves as the output terminal of the phase inverter unit 603, which is connected to the negative input terminal of the second operational amplifier unit A2. A gate electrode of the NMOS transistor M9 serving as the input terminal of the phase inverter unit 603 is connected to the output terminal of the first complementary circuit unit 602. And a source electrode of the NMOS transistor M9 is connected to the ground GND.

The current mirror unit 604 includes PMOS transistors M10, M12 and M14, and NMOS transistors M15 and M17.

A source electrode of the PMOS transistor M10 is connected to a voltage source VDC. A drain electrode of the PMOS transistor M10 is connected to a source electrode of the PMOS transistor M12. A gate electrode of the PMOS transistor M12 serves as the input terminal of the current mirror unit 604. And the input terminal of the current mirror unit 604 is connected to the output terminal of the second operational amplifier unit A2.

A drain electrode of the PMOS transistor M12 is connected to a source electrode of the PMOS transistor M14. A diode connection mode of gate-drain short circuit is adopted in both the PMOS transistor M14 and the NMOS transistor M15. A drain electrode of the PMOS transistor M14 is connected to a drain electrode of the NMOS transistor M15 and the connection point serves as the output terminal of the current mirror unit 604. And the output terminal of the current mirror unit 604 is connected to the second input terminal of the charging and discharging unit 601 and the second input terminal of the first complementary circuit unit 602. A source electrode of the NMOS transistor M15 is connected to a drain electrode of the NMOS transistor M17. A gate electrode of the NMOS transistor M17 is connected to the voltage source VDC, and a source electrode of the NMOS transistor M17 is connected to the ground GND.

The second complementary circuit unit 605 includes PMOS transistors M11 and M13, and NMOS transistors M16 and M18.

A source electrode of the PMOS transistor M11 is connected to a voltage source VDC. A drain electrode of the PMOS transistor M11 is connected to a source electrode of the PMOS transistor M13. A drain electrode of the PMOS transistor M13 is connected to a drain electrode of the NMOS transistor M16 and the connection point serves as the output terminal of the second complementary circuit unit 605, and the output terminal of the second complementary circuit unit 605 is connected to the positive input terminal of the second operational amplifier unit A2.

A source electrode of the NMOS transistor M16 is connected to a drain electrode of the NMOS transistor M18. A source electrode of the NMOS transistor M18 is connected to the ground GND. A gate electrode of the PMOS transistor M13 serves as the input terminal of the second complementary circuit unit 605, and the input terminal of the second complementary circuit unit 605 is connected to the output terminal of the second operational amplifier unit A2. A gate electrode of the NMOS transistor M16 is connected to an external bias BIAS. A gate electrode of the PMOS transistor M11 is connected to the ground GND. And a gate electrode of the NMOS transistor M18 is connected to the voltage source VDC.

It should be realized by those skilled in the art that, the above five modules are only examples of the present disclosure. When applied to the charge pump circuit proposed according to the present disclosure, the modules may be used separately, that is, only one or several sub-units of the modules may be used, which will not affect the implementation of the present disclosure.

Herein, a working principle and a working process of the circuit according to the present disclosure are described in conjunction with the embodiment shown in FIG. 7.

Firstly, how to address the issue of charge sharing with the charge pump circuit according to the present disclosure is described. In FIG. 7, locations of the current mirror and the switch transistor are changed. The capacitor of the drain electrode of the current mirror is at the same node with the capacitor $C_{cp}$ of the charge pump circuit. In this case, voltage variations of capacitors of the drain electrodes of the two current mirrors are equal, and the charge sharing is avoided.

In FIG. 7, operational amplifiers are added in the circuit according to the present disclosure. $I_{ch}$ may decrease as the output voltage $V_{cp\_out}$ rises due to a channel length modulation effect. The voltage at the negative input terminal of the first operational amplifier unit A1 rises. A decreasing of a voltage at the output terminal of the first operational amplifier unit A1 results in a decreasing of a voltage at the gate electrode of the transistor M3. At this time, it is too late for the positive input terminal of the first operational amplifier unit A1 to change. Since a voltage at the gate electrode of the transistor M3 decreases and a drain-source voltage of the transistor M3 does not change, a current I1 rises and a current I2 may also rise correspondingly. If a gate-source voltage of M5 does not change, a voltage at the drain electrode of M5 may rise. Finally, voltages at the positive and negative input terminals of the first operational amplifier unit A1 are equal. That is to say, a potential at a node OUT equals to a potential at a node X, while it is ensured that the transistors M2, M3, M4 and M5 operate within a range of saturation region. In a case that the output signal UP from the phase frequency discriminator is a low level and the output signal DOWN from the phase frequency discriminator is a high level, the switch transistors M0 and M6 are switched on, the gate electrodes of the transistor M2 and the transistor M3 have the same bias, the drain electrodes of the transistor M2 and the transistor M3 are clamped by the first operational amplifier unit A1, hence $I_{ch}=I_1=I_2$. Similarly, the gate electrodes of the transistor M4 and transistor M5 have the same bias and potentials at the drain electrodes of the transistor M4 and transistor M5 are the same, therefore, $I_{dis}=I_2$, and then $I_{ch}=I_{dis}$.

Figure 5:
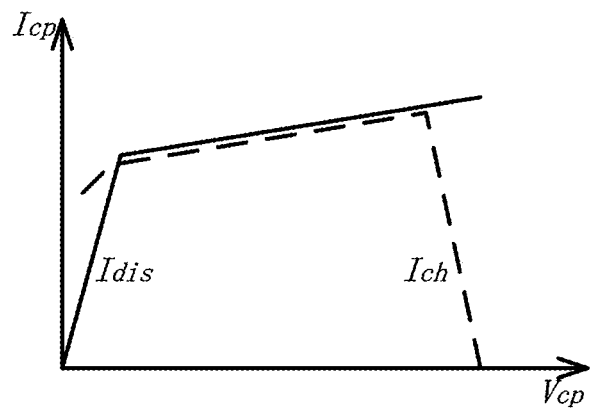
FIG. 5 is a schematic diagram of waveforms of an output voltage and an output current of the second existing charge pump circuit structure.
Figure 8:
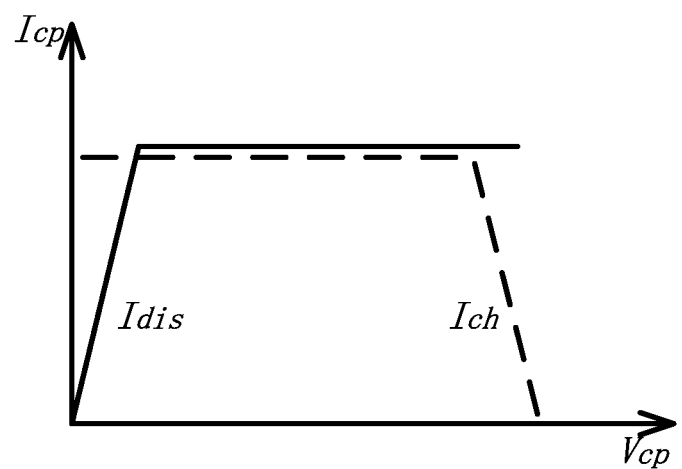
FIG. 8 is a schematic diagram of waveforms of an output voltage and an output current of a charge pump circuit according to the present disclosure.

Finally, the principle of implementing constant charging and discharging currents according to the present disclosure is described. By comparing the waveform diagram in FIG. 5 and the waveform diagram in FIG. 8, it can be seen apparently that, in the second existing charge pump circuit, $I_{ch}$ and $I_{dis}$ are equal to each other and may change as the output voltage changes. In the improved charge pump circuit according to the present disclosure, $I_{ch}$ and $I_{dis}$ are equal to each other and maintained constant. Based on an equation $V_{cp}=Q/C=I\cdot\Delta t/C$, $V_{cp}$ is directly proportional to the charging/discharging current. And the voltage $V_{cp}$ across $C_{cp}$ may be controlled precisely if the charging and discharging currents are constant.

Figure 1:
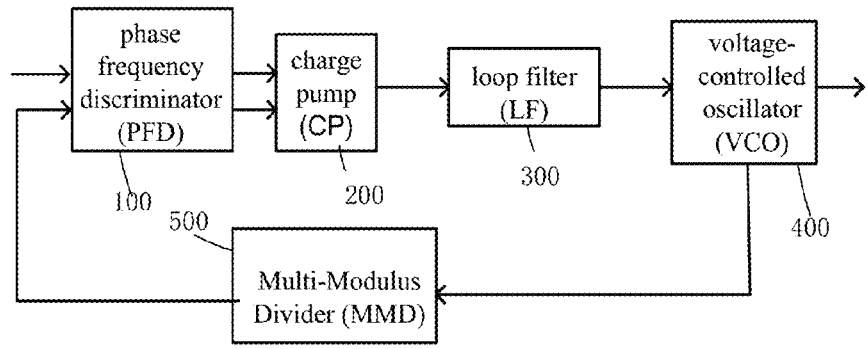
FIG. 1 is a schematic structural diagram of a charge pump phase-locked loop system.
Figure 2:
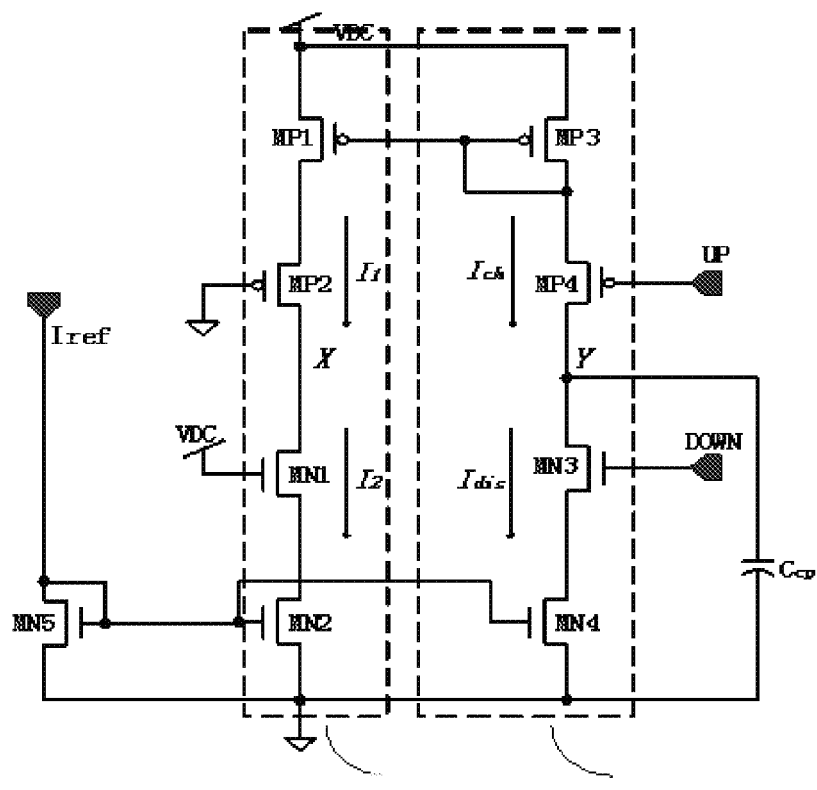
FIG. 2 is a schematic structural diagram of a first existing charge pump circuit.
Figure 3:
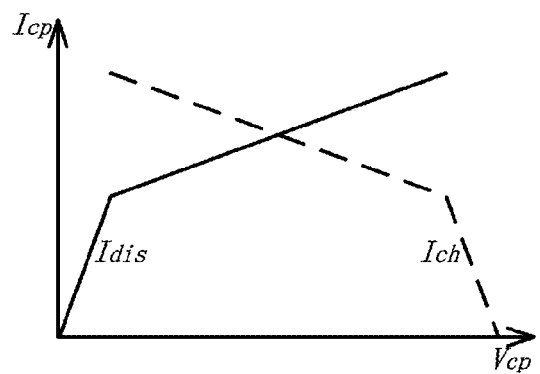
FIG. 3 is a schematic diagram of waveforms of an output voltage and an output current of the first existing charge pump circuit structure.
Figure 4:
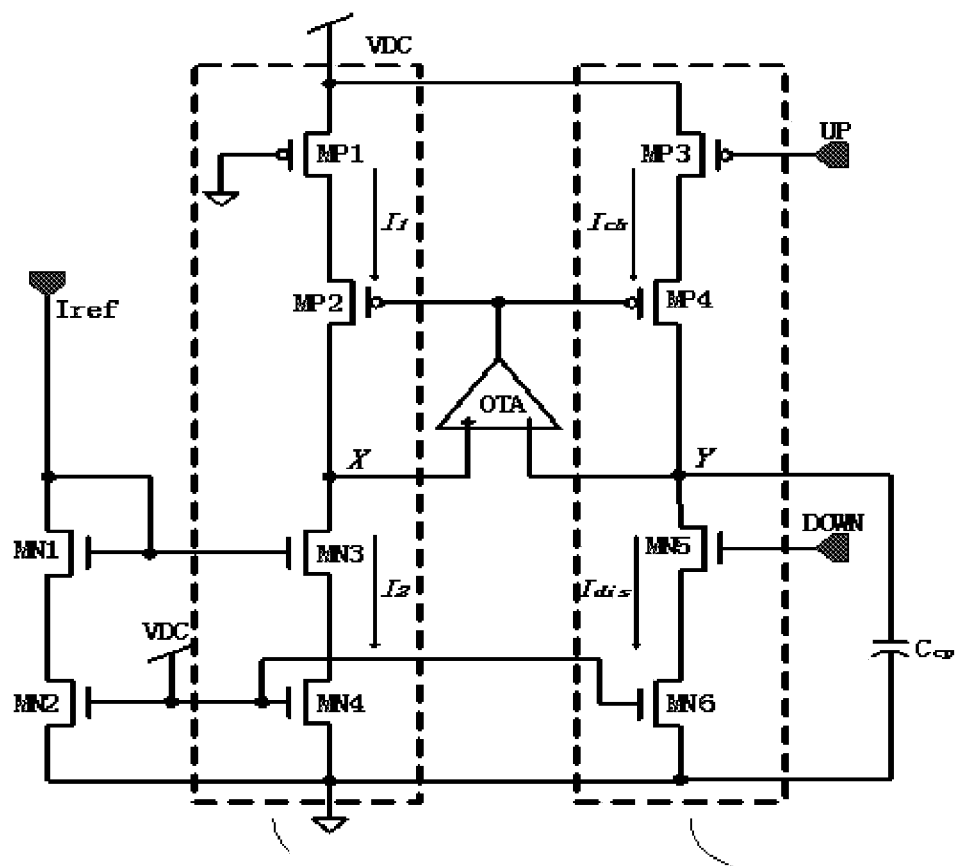
FIG. 4 is a schematic structural diagram of a second existing charge pump circuit.

In the existing charge pump circuit in FIG. 4, an operational amplifier unit OTA is provided between a branch circuit 1 of the current mirror and a branch circuit 2 of the current mirror. Thus, potentials at nodes X and Y are the same, and $I_{ch}=I_{dis}=I_1/I_2$. $I_1/I_2$ mirrors $I_{ref}$, and $I_1$ is constant if the potential at the node X is constant. In fact, the voltage across the capacitor $C_{cp}$ (the potential at the node Y) may change, which results in that: the potential at the node X changes as the potential at the node Y changes, and a source-drain voltage of a current mirror transistor on the branch circuit 1 changes, thereby changing $I_1/I_2$, and $I_{ch}$ and $I_{dis}$.

In FIG. 7, in the charge pump circuit according to the present disclosure, the phase inverter unit 603 and the second operational amplifier unit A2 are added. $I_1/I_2$ is maintained constant with a negative feedback and then $I_{ch}$ and $I_{dis}$ are maintained unchanged. A specific process is as follows. If the output voltage Vcp_out rises, and the potential at the node X also rises due to a clamping of the first operational amplifier unit A1, that is, a drain-source voltage of M5 rises. In this case, $I_2$ is increased due to the channel length modulation effect. After passing through the phase inverter unit composed of M8 and M9, the potential at the node X may decrease at node Y. Since the node Y is the negative input terminal of the second operational amplifier unit A2, a gate voltage of the transistor M12 in the current mirror unit rises and a gate-source voltage of the transistor M12 decreases, a current flowing through the transistor M12 may decrease, i.e. the current flowing through the branch circuit of the current mirror unit decreases. Since a diode connection mode is adopted in the transistor M15, the gate voltage of the transistor M15 may decrease correspondingly, that is, the gate voltage of the transistor M5 decreases, therefore, the current $I_2$ decreases and the current $I_2$ can be maintained constant. Further, since $I_{ch}=I_{dis}=I_1/I_2$, $I_{ch}$ and $I_{dis}$ are equal to each other and maintained constant.

In summary, as compared with the first existing charge pump circuit, the matching issue of charging and discharging currents and the issue of charge sharing are addressed in the present disclosure. And as compared with the second existing charge pump circuit two complementary circuit units and two operational amplifier units are adopted in the charge pump circuit according to the present disclosure. The two complementary circuit units respectively compensate the charging and discharging unit in a positive way and a negative way. In this case, the charging current and discharging current of the capacitor can be constant, thus the issue of non-constant charging and discharging currents is addressed, the voltage of the charge pump capacitor changes linearly, and the capacitor may be charged or discharged more precisely. The charge pump circuit according to the present disclosure is applicable to an application with a low voltage and a low power consumption since it has a simple structure and a high matching precision between a charging current source and a discharging current source and is easy to be integrated.

The above embodiments are only preferred embodiments of the present disclosure and do not limit the present disclosure in any form. Preferred embodiments of the present invention are disclosed above, which should not be interpreted as limiting the present invention. Numerous alternations, modifications, and equivalents can be made to the technical solution of the present invention by those skilled in the art in light of the methods and technical content disclosed herein without deviation from the scope of the present invention. Therefore, any alternations, modifications, and equivalents made to the embodiments above according to the technical essential of the present invention without deviation from the scope of the present invention should fall within the scope of protection of the present invention.

The invention claimed is:

1. A charge pump circuit for a charge pump phase-locked loop, comprising: a charging and discharging unit, a first complementary circuit unit, a first operational amplifier unit (A1), a phase inverter unit, a second complementary circuit unit, a current mirror unit and a second operational amplifier unit (A2), wherein
    an output terminal of the charging and discharging unit is connected to a negative input terminal of the first operational amplifier unit (A1);
    an output terminal of the first complementary circuit unit is connected to a positive input terminal of the first operational amplifier unit (A1), and an output terminal of the first operational amplifier unit (A1) is connected to a first input terminal of the charging and discharging unit and a first input terminal of the first complementary circuit unit;
    an input terminal of the phase inverter unit is connected to an output terminal of the first complementary circuit unit, and an output terminal of the phase inverter unit is connected to a negative input terminal of the second operational amplifier unit (A2);
    an output terminal of the second complementary circuit unit is connected to a positive input terminal of the second operational amplifier unit (A2), and an output terminal of the second operational amplifier unit is connected to an input terminal of the current mirror unit and an input terminal of the second complementary circuit unit; and
    an output terminal of the current mirror unit is connected to a second input terminal of the charging and discharging unit and a second input terminal of the first complementary circuit unit.

2. The charge pump circuit for the charge pump phase-locked loop according to claim 1, wherein the charging and discharging unit comprises PMOS transistors M0 and M2, and NMOS transistors M4 and M6, wherein
    a source electrode of the PMOS transistor M0 is connected to a voltage source VDC, a drain electrode of the PMOS transistor M0 is connected to a source electrode of the PMOS transistor M2, and a drain electrode of the PMOS transistor M2 is connected to a drain electrode of the NMOS transistor M4 and the connection point serves as the output terminal of the charging and discharging unit;
    the output terminal of the charging and discharging unit is connected to the negative input terminal of the first operational amplifier unit (A1), a source electrode of the NMOS transistor M4 is connected to a drain electrode of the NMOS transistor M6, a source electrode of the NMOS transistor M6 is connected to the ground GND, and a gate electrode of the PMOS transistor M2 serves as the first input terminal of the charging and discharging unit; and
    the first input terminal of the charging and discharging unit is connected to the output terminal of the first operational amplifier unit (A1), a gate electrode of the NMOS transistor M4 serving as the second input terminal of the charging and discharging unit is connected to the output terminal of the current mirror unit, and a gate electrode of the PMOS transistor M0 and a gate electrode of the NMOS transistor M6 are respectively connected to an output signal UP and an output signal DOWN which are output from a phase frequency discriminator.

3. The charge pump circuit for the charge pump phase-locked loop according to claim 1, wherein the first complementary circuit unit comprises PMOS transistors M1 and M3, and NMOS transistors M5 and M7, wherein
    a source electrode of the PMOS transistor M1 is connected to a voltage source VDC, a drain electrode of the PMOS transistor M1 is connected to a source electrode of the PMOS transistor M3, and a drain electrode of the PMOS transistor M3 is connected to a drain electrode of the NMOS transistor M5 and the connection point serves as the output terminal of the first complementary circuit unit;
    the output terminal of the first complementary circuit unit is connected to the positive input terminal of the first operational amplifier unit (A1), a source electrode of the NMOS transistor M5 is connected to a drain electrode of the NMOS transistor M7, a source electrode of the NMOS transistor M7 is connected to the ground GND, and a gate electrode of the PMOS transistor M3 serves as the first input terminal of the first complementary circuit unit;
    the first input terminal of the first complementary circuit unit is connected to the output terminal of the first operational amplifier unit (A1), and a gate electrode of the NMOS transistor M5 serves as the second input terminal of the first complementary circuit unit; and
    the second input terminal of the first complementary circuit unit is connected to the output terminal of the current mirror unit, a gate electrode of the PMOS transistor M1 is connected to the ground GND, and a gate electrode of the NMOS transistor M7 is connected to the voltage source VDC.

4. The charge pump circuit for the charge pump phase-locked loop according to claim 1, wherein the phase inverter unit comprises a PMOS transistor M8 and an NMOS transistor M9, wherein
    a diode connection mode of gate-drain short circuit is adopted in the PMOS transistor M8, a source electrode of the PMOS transistor M8 is connected to a voltage source VDC, a drain electrode of the PMOS transistor M8 is connected to a drain electrode of the NMOS transistor M9 and the connection point serves as the output terminal of the phase inverter unit; and
    the output terminal of the phase inverter unit is connected to the negative input terminal of the second operational amplifier unit (A2), a gate electrode of the NMOS transistor M9 serves as the input terminal of the phase inverter unit, the input terminal of the phase inverter unit is connected to the output terminal of the first complementary circuit unit, and a source electrode the NMOS transistor M9 is connected to the ground GND.

5. The charge pump circuit for charge pump phase-locked loop according to claim 1, wherein the current mirror unit comprises PMOS transistors M10, M12 and M14, and NMOS transistors M15 and M17, wherein a source electrode of the PMOS transistor M10 is connected to a voltage source VDC, a drain electrode of the PMOS transistor M10 is connected to a source electrode of the PMOS transistor M12, and a gate electrode of the PMOS transistor M12 serves as the input terminal of the current mirror unit;

the input terminal of the current mirror unit is connected to the output terminal of the second operational amplifier unit (A2), a drain electrode of the PMOS transistor M12 is connected to a source electrode of the PMOS transistor M14, a diode connection mode of gate-drain short circuit is adopted in both the PMOS transistor M14 and the NMOS transistor M15, and a drain electrode of the PMOS transistor M14 is connected to a drain electrode of the NMOS transistor M15 and the connection point serves as the output terminal of the current mirror unit; and the output terminal of the current mirror unit is connected to the second input terminal of the charging and discharging unit and the second input terminal of the first complementary circuit unit, a source electrode of the NMOS transistor M15 is connected to a drain electrode of the NMOS transistor M17, a gate electrode of the NMOS transistor M17 is connected to the voltage source VDC, and a source electrode of the NMOS transistor M17 is connected to the ground GND.

6. The charge pump circuit for the charge pump phase-locked loop according to claim 1, wherein the second complementary circuit unit comprises PMOS transistors M11 and M13, and NMOS transistors M16 and M18, wherein a source electrode of the PMOS transistor M11 is connected to a voltage source VDC, a drain electrode of the PMOS transistor M11 is connected to a source electrode of the PMOS transistor M13, and a drain electrode of the PMOS transistor M13 is connected to a drain electrode of the NMOS transistor M16 and the connection point serves as the output terminal of the second complementary circuit unit;

the output terminal of the second complementary circuit unit is connected to the positive input terminal of the second operational amplifier unit (A2), a source electrode of the NMOS transistor M16 is connected to a drain electrode of the NMOS transistor M18, a source electrode of the NMOS transistor M18 is connected to the ground GND, and a gate electrode of the PMOS transistor M13 serves as the input terminal of the second complementary circuit unit; and the input terminal of the second complementary circuit unit is connected to the output terminal of the second operational amplifier unit (A2), a gate electrode of the NMOS transistor M16 is connected to an external bias BIAS, a gate electrode of the PMOS transistor M11 is connected to the ground GND, and a gate electrode of the NMOS transistor M18 is connected to the voltage source VDC.

* * * * *